US011751440B2

(12) United States Patent
Zheng

(10) Patent No.: US 11,751,440 B2
(45) Date of Patent: Sep. 5, 2023

(54) DISPLAY PANEL AND METHOD OF MANUFACTURING DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Jiexin Zheng, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 547 days.

(21) Appl. No.: 16/760,887

(22) PCT Filed: Apr. 9, 2020

(86) PCT No.: PCT/CN2020/083857
§ 371 (c)(1),
(2) Date: Apr. 30, 2020

(87) PCT Pub. No.: WO2021/179390
PCT Pub. Date: Sep. 16, 2021

(65) Prior Publication Data
US 2022/0320219 A1    Oct. 6, 2022

(30) Foreign Application Priority Data

Mar. 11, 2020   (CN) .......................... 202010167068.4

(51) Int. Cl.
*H10K 59/126* (2023.01)
*G09G 3/3225* (2016.01)
(Continued)

(52) U.S. Cl.
CPC ......... *H10K 59/126* (2023.02); *G09G 3/3225* (2013.01); *H10K 71/00* (2023.02);
(Continued)

(58) Field of Classification Search
CPC ............. H01L 27/3276; H01L 27/3279; H01L 27/3272; H01L 51/56; G09G 3/3225;
(Continued)

(56) References Cited

U.S. PATENT DOCUMENTS 10,861,978 B2 * 12/2020 Lee .................... H01L 29/78633
2008/0246042 A1 * 10/2008 Ting .................. G02F 1/136213
257/E21.477
(Continued)

FOREIGN PATENT DOCUMENTS

CN      103107182 A    5/2013
CN      104733499 A    6/2015
(Continued)

OTHER PUBLICATIONS

International Search Report in International application No. PCT/CN2020/083857, dated Nov. 26, 2020.
(Continued)

*Primary Examiner* — Sardis F Azongha
(74) *Attorney, Agent, or Firm* — PV IP PC; Wei Te Chung; Zhigang Ma

(57) ABSTRACT

A display panel and a method of manufacturing a display panel are disclosed. The display panel is provided with a first electrode disposed on the same layer as a source electrode. A plurality of signal lines are disposed on the same layer as a plurality of light shielding patterns, so that a light shielding layer and a gate line layer can be used for wiring layouts, and a spacing between two electrodes of a parasitic capacitance formed between metal wirings and metal film layers is increased. In this manner, a parasitic capacitance of a
(Continued)

subpixel driving circuit can be reduced, so that response times of the display panel can also be reduced.

19 Claims, 3 Drawing Sheets

(51) Int. Cl.
*H10K 71/00* (2023.01)
*H10K 59/131* (2023.01)
*H10K 59/12* (2023.01)

(52) U.S. Cl.
CPC ............... *G09G 2300/0426* (2013.01); *G09G 2300/0842* (2013.01); *G09G 2320/0252* (2013.01); *H10K 59/1201* (2023.02); *H10K 59/131* (2023.02)

(58) Field of Classification Search
CPC .. G09G 3/3291; G09G 3/3233; G09G 3/3258; H10K 59/126; H10K 59/131; H10K 71/00
See application file for complete search history.

(56) References Cited

U.S. PATENT DOCUMENTS

2014/0332768 A1  11/2014  Kwon et al.
2019/0074383 A1*  3/2019  Yu ........................ H01L 29/7869

FOREIGN PATENT DOCUMENTS

| CN | 107016964 A | 8/2017 |
| CN | 207909879 U | 9/2018 |
| CN | 109300917 A | 2/2019 |
| CN | 109585520 A | 4/2019 |

OTHER PUBLICATIONS

Written Opinion of the International Searching Authority in International application No. PCT/CN2020/083857, dated Nov. 26, 2020.

Chinese Office Action issued in corresponding Chinese Patent Application No. 202010004429.3 dated Mar. 3, 2021, pp. 1-8.

* cited by examiner

DISPLAY PANEL AND METHOD OF MANUFACTURING DISPLAY PANEL

RELATED APPLICATIONS

This application is a National Phase of PCT Patent Application No. PCT/CN2020/083857 having international filing date of Apr. 9, 2020, which claims the benefit of priority of Chinese Patent Application No. 202010167068.4 filed on Mar. 11, 2020. The contents of the above applications are all incorporated by reference as if fully set forth herein in their entirety.

BACKGROUND OF INVENTION

1. Field of Invention

The present invention relates to a technical field of displays, and particularly to, a display panel and a method of manufacturing a display panel.

2. Related Art

With continuous improvement of resolution and refresh rates of organic light emitting diode (OLED) display panels, requirements for response times are becoming more and more strict, whereas a key factor in reducing response times of OLED display panels is to reduce internal parasitic capacitance.

Organic light-emitting diode (OLED) display panels are equipped with many metal materials such as traces, storage capacitors, and OLED anodes. These metal materials overlap in a large area, resulting in an increase in parasitic capacitance inside the panels. According to the parallel plate capacitance formula: $C=\varepsilon 0\varepsilon rS/L$, the smaller the overlap area is, the larger metal line spacing is, and the smaller the parasitic capacitance is. conventional top-gate structure OLED display panels, gate line layers and source/drain electrode layers are used to lay out signal traces, and at the same time, these two metal layers function as storage capacitors of the subpixel driving circuit. Since a distance between the two metal materials of the gate line layers and the source/drain electrode layers is small, the parasitic capacitance becomes large, which makes it impossible to reduce response times of the display panels. Although the overlap area of the metal layers can be reduced to mitigate the parasitic capacitance, aperture ratios of pixels are significantly influenced.

Accordingly, a problem that large overlap areas of metal layers give rise to an increase in parasitic capacitance and a failure in reducing response times exists in conventional display panels. Therefore, it is imperative to provide a display panel and a method of manufacturing a display panel to cure the defect.

SUMMARY OF INVENTION

An embodiment of the present disclosure is to provide a display panel and a method of manufacturing a display panel to overcome the problem that large overlap areas of metal layers give rise to an increase in parasitic capacitance and a failure in reducing response times in conventional display panels.

An embodiment of the present disclosure provides a display panel, comprising a base substrate; a light shielding layer disposed on the base substrate and comprising a plurality of light shielding patterns arranged in an array; a buffer layer disposed on the base substrate and covering the light shielding layer; a thin-film transistor array layer comprising a plurality of thin-film transistors, wherein each of the thin-film transistors comprises an active layer, a gate line layer, a source electrode, and a drain electrode; a display device layer disposed on a side of the thin-film transistor array layer away from the base substrate, and comprising an anode, a light-emitting layer, and a cathode disposed in a stack arrangement; and a plurality of first electrodes disposed on the same layer as the source electrode, wherein each of the first electrodes has an orthographic projection area projected on the base substrate and overlapping an orthographic projection area of the anode projected on the base substrate, and a storage capacitor is configured with the first electrode and the anode.

According to one embodiment of the present disclosure, the display panel further comprises a gate insulating layer and an interlayer dielectric layer, wherein the gate line layer is disposed on a side of the gate insulating layer away from the base substrate, a plurality of via holes are provided on the interlayer dielectric layer, and the first electrodes pass through the via holes of the interlayer dielectric layer to be connected to the gate line layer.

According to one embodiment of the present disclosure, the display panel further comprises a plurality of signal lines arranged on the same layer as the light shielding patterns, wherein the thin-film transistors pass through the interlayer dielectric layer and the buffer layer over the via holes to be connected to the signal lines.

According to one embodiment of the present disclosure, the signal lines include a data signal line, a power supply high-voltage signal line, and a sensing signal line, and the thin-film transistors include a driving thin-film transistor and a switch thin-film transistor, wherein the driving thin-film transistor includes a source electrode connected to the power supply high voltage signal line, a drain electrode connected to the anode, and a gate electrode connected to the first electrode.

According to one embodiment of the present disclosure, the display panel further comprises a plurality of subpixel areas arranged in an array, wherein the subpixel areas are each provided with subpixel driving circuits, wherein each of the subpixel driving circuits comprises the driving thin-film transistor, the storage capacitor, and at least two the switch thin-film transistors.

According to one embodiment of the present disclosure, each of the subpixel circuits comprises a first switch thin-film transistor and a second switch thin-film transistor, wherein the first switch thin-film transistor comprises a source electrode connected to the data signal line, a drain electrode connected to the gate electrode of the driving thin-film transistor, and a gate electrode connected to a first scanning control signal, and wherein the second switch thin-film transistor comprises a source electrode connected to the drain electrode of the driving thin-film transistor, a drain electrode connected to the sensing signal line, and a gate electrode connected to a second scanning control line.

An embodiment of the present disclosure further provides a display panel, comprising a base substrate; a light shielding layer disposed on the base substrate and comprising a plurality of light shielding patterns arranged in an array; a buffer layer disposed on the base substrate and covering the light shielding layer; a thin-film transistor array layer comprising a gate insulating layer, an interlayer dielectric layer, and a plurality of thin-film transistors, wherein each of the thin-film transistors comprises an active layer, a gate line layer, a source electrode, and a drain electrode, and the gate line layer is disposed on a side of the gate insulating layer away from the base substrate; and a display device layer disposed on a side of the thin-film transistor array layer away from the base substrate, and comprising an anode, a light-emitting layer, and a cathode disposed in a stack arrangement; and a plurality of first electrodes disposed on the same layer as the source electrode, and a plurality of signal lines arranged on the same layer as the light shielding patterns, wherein each of the first electrodes has an orthographic projection area projected on the base substrate and overlapping an orthographic projection area of the anode projected on the base substrate, and a storage capacitor is configured with the first electrode and the anode, wherein a plurality of via holes are provided on the interlayer dielectric layer and extend through the buffer layer, and the thin-film transistors pass through the via holes of the interlayer dielectric layer and the buffer layer to be connected to the signal lines.

According to one embodiment of the present disclosure, the signal lines comprise a data signal line, a power supply high-voltage signal line, and a sensing signal line, and the thin-film transistors comprise a driving thin-film transistor and a switch thin-film transistor, wherein the driving thin-film transistor has a source electrode connected to the power supply high voltage signal line, a drain electrode connected to the anode, and a gate electrode connected to the first electrode.

According to one embodiment of the present disclosure, the display panel further comprises a plurality of subpixel areas arranged in an array, wherein the subpixel areas are each provided with subpixel driving circuits, wherein each of the subpixel driving circuits comprises the driving thin-film transistor, the storage capacitor, and at least two the switch thin-film transistors.

According to one embodiment of the present disclosure, each of the subpixel circuits comprises a first switch thin-film transistor and a second switch thin-film transistor, wherein the first switch thin-film transistor comprises a source electrode connected to the data signal line, a drain electrode connected to the gate electrode of the driving thin-film transistor, and a gate electrode connected to a first scanning control signal, and wherein the second switch thin-film transistor comprises a source electrode connected to the drain electrode of the driving thin-film transistor, a drain electrode connected to the sensing signal line, and a gate electrode to connected a second scanning control line.

An embodiment of the present disclosure further provides a method of manufacturing a display panel, comprising providing a base substrate, and etching a light shielding metal material deposited on the base substrate to form a plurality of light shielding patterns; forming a buffer layer on the base substrate, wherein the buffer layer covers the light shielding patterns; depositing an active layer, a gate insulating layer, and a gate line layer sequentially on a side of the buffer layer away from the base substrate; forming an interlayer dielectric layer on the side of the buffer layer away from the base substrate, wherein the interlayer dielectric layer covers the gate line layer, the gate insulating layer, and the active layer; etching a source/drain electrode material deposited on the interlayer dielectric layer to form a source electrode, a drain electrode, and a first electrode; forming a passivation protection layer on a side of the interlayer dielectric layer away from the buffer layer; and forming an anode, a light-emitting layer, and a cathode sequentially on the passivation protection layer, wherein an anode has an orthographic projection area projected on the base substrate and overlapping an orthographic projection area of the first electrode projected on the base substrate, and a storage capacitor is configured with the anode and the first electrode.

According to one embodiment of the present disclosure, while etching the light shielding metal material to form the light shielding patterns, a plurality of signal lines arranged at intervals are also formed.

According to one embodiment of the present disclosure, the signal lines comprise a data signal line, a power supply high-voltage signal line, and a sensing signal line, and a plurality of via holes are provided on the interlayer dielectric layer and extend through the buffer layer, wherein the source electrode and the drain electrode pass through the via holes of the interlayer dielectric layer and the buffer layer to be connected to the signal lines.

According to one embodiment of the present disclosure, the light shielding patterns and the signal lines are all provided with a copper and molybdenum stacked structure or a copper, molybdenum and titanium stacked structure.

The embodiment of the present disclosure has advantageous effects as follows: the display panel provided by the embodiment of the present disclosure is provided with the first electrode disposed on the same layer as the source electrode and the drain electrode of the thin-film transistor, and the first electrode and the anode of the display device layer are used to cooperatively construct the storage capacitor. In addition, the signal lines and the light shielding patterns are disposed on the same layer, so that the light shielding layer and the gate line layer can be used for wiring layouts, and a spacing between two electrodes of a parasitic capacitance formed between metal wirings and metal film layers is increased, thereby reducing a parasitic capacitance of the subpixel driving circuit and response times of the display panel.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED
EMBODIMENTS

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

The disclosure is further described below in conjunction with the drawings and specific embodiments.

Figure 1:
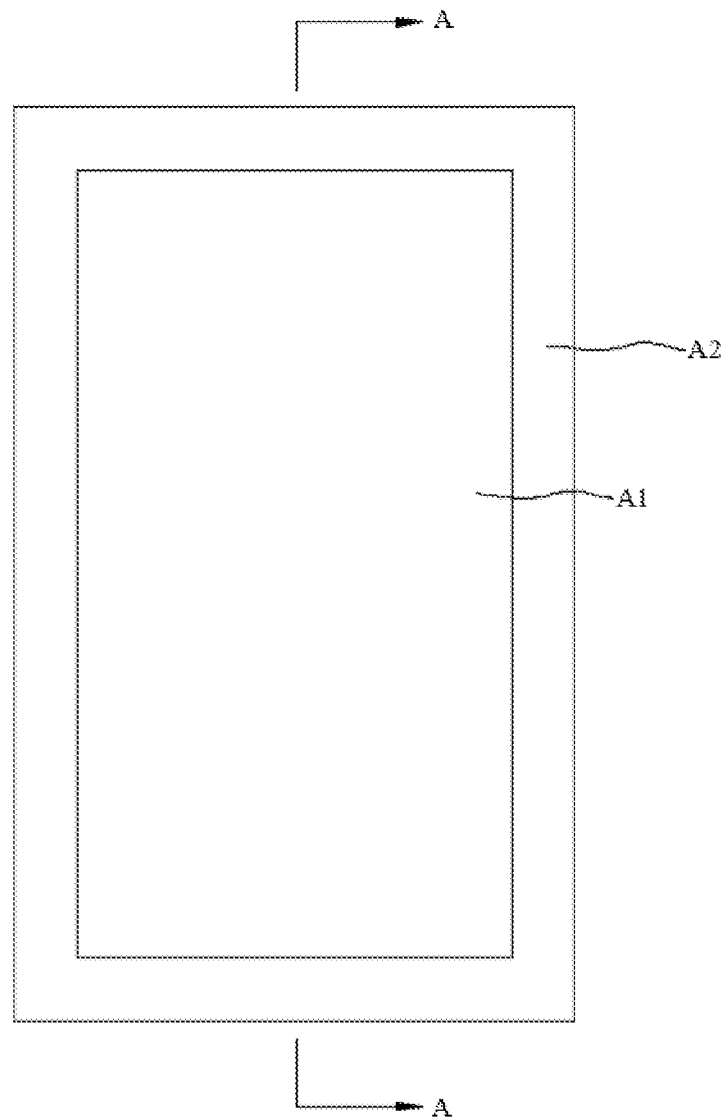
FIG. 1 is a schematic plan view of a display panel provided by an embodiment of the present disclosure.
Figure 2:
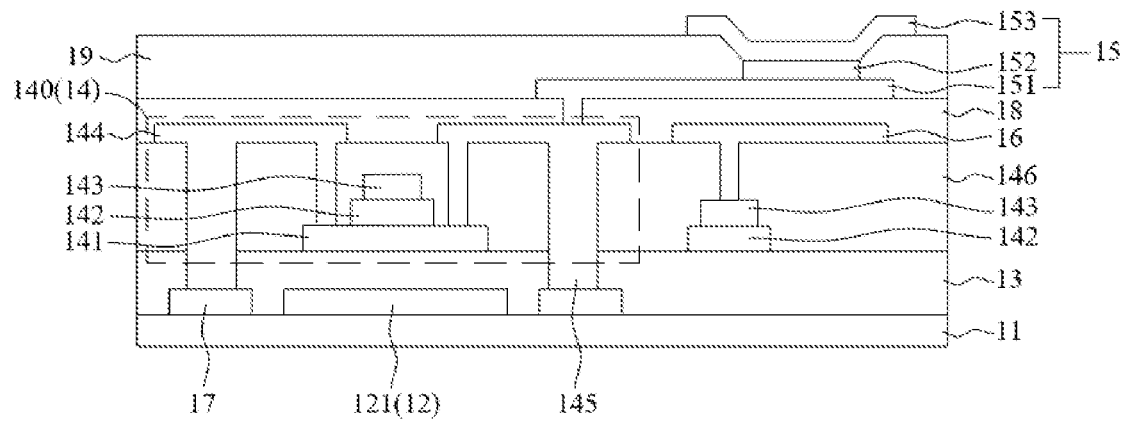
FIG. 2 is a schematic structural view showing a cross-section taken along line A-A of the display panel of FIG. 1 of the embodiment of the present disclosure.
Figure 3:
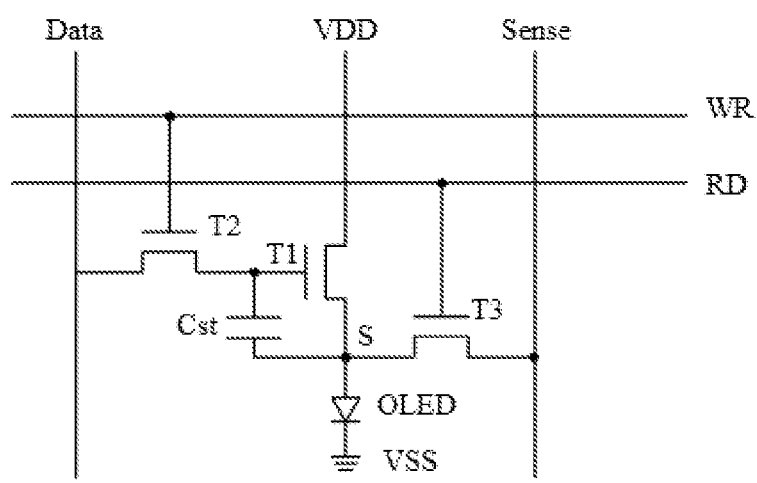
FIG. 3 is a schematic view of a subpixel driving circuit provided by an embodiment of the present disclosure.

An embodiment of the present disclosure provides a display panel, which will be described in detail below with reference to FIGS. 1 to 3. As shown in FIG. 1, FIG. 1 is a schematic plan view of a display panel provided by an embodiment of the present disclosure. The display panel includes a display area A1 and a non-display area A2 surrounding the display area A1. FIG. 2 is a schematic structural view showing a cross-section taken along line A-A of the display panel of FIG. 1 of the embodiment of the present disclosure. The display panel includes a base substrate 11, a light shielding layer 12, a buffer layer 13, a thin-film transistor array layer 14, and a display device layer 15 all disposed in a stack arrangement. The light shielding layer 12 is disposed on the base substrate 11 and includes a plurality of light shielding patterns 121 arranged in an array. The buffer layer 13 is disposed on the base substrate 11 and covers the light shielding layer 12.

The thin-film transistor array layer 14 includes a plurality of thin-film transistors 140. Each of the thin-film transistors 140 includes an active layer 141, a gate line layer 143, a source electrode 144, and a drain electrode 145. The active layer 141 is disposed on a side of the buffer layer 13 away from the base substrate 11, wherein the active layer 141 has an orthographic projection area projected on the base substrate 11 and covered by an orthographic projection area of the light shielding patterns projected on the base substrate 11, so that external light is prevented from impinging on the active layer 141 through the base substrate 11, thereby ensuring stability of the thin-film transistors 140. The thin-film transistors 140 provided by the embodiment of the present disclosure are thin-film transistors having top-gate structures, wherein a gate line layer 142 is disposed on a side of the active layer 141 away from the buffer layer 13; that is, the gate line layer 143 is located at a first metal layer as known in the art, and the source electrode 144 and the drain electrode 145 are located at a second metal layer as known in the art.

In the embodiment of the present disclosure, the active layer 141 is made of indium gallium zinc oxide (IGZO). IGZO has electron mobility higher than that of ordinary semiconductor materials, so as to increase a turn on speed and a turn off speed of thin-film transistors, thereby improving response times of display panels and achieving faster refresh rates. In addition, the faster response times also greatly improve a line scan speed of the display panels. Certainly, the active layer 141 may also be made of other semiconductor materials, which is not limited here.

The display device layer 15 is disposed on a side of the thin-film transistor array layer 14 away from the base substrate 11. A passivation protection layer 18 is disposed between the display device layer 15 and the thin-film transistor array layer 14. The display device layer 15 includes an anode 151, a light-emitting layer 152, and a cathode 153. The anode 151 is disposed on a side of the passivation protection layer 18 away from the interlayer dielectric layer 146; that is, the anode is located at a third metal layer as known in the art. A pixel definition layer 19 is disposed on the passivation protection layer 18 and covers the anode 151. A via hole is provided on the pixel definition layer 19 to expose part of the anode 151, wherein the light-emitting layer 152 is disposed in the via hole, and the cathode 153 covers the light-emitting layer 152.

In the embodiment of the present disclosure, a plurality of subpixel areas (not shown) arranged in an array in the display area A1. The subpixel areas are each provided with subpixel driving circuits. As shown in FIG. 3, FIG. 3 is a schematic view of a subpixel driving circuit provided by an embodiment of the present disclosure. The subpixel driving circuit is a subpixel driving circuit of a structure including three thin-film transistors and one capacitor, also referred to as 3T1C for short, specifically including a driving thin-film transistor T1, a first switch thin-film transistor T2, a second thin-film transistor T3, and a storage capacitor Cst. A gate electrode of the driving thin-film transistor T1, a drain electrode of the first switch thin-film transistor T2, and a first electrode of the storage capacitor Cst are connected to a same node. A drain electrode of the driving thin-film transistor T1, an anode of the storage capacitor Cst, and a drain electrode of the second thin-film transistor T3 are connected to a node S.

The thin-film transistor 140 shown in FIG. 1 is the driving thin-film transistor T1, structures of the other switch thin-film transistors are almost the same as that of the driving thin-film transistor T1. The storage capacitor Cst is configured with a plurality of first electrodes 16 arranged on the same layer as the source electrode, and the anode 151 of the display device layer 15. Each of the first electrodes 16 has an orthographic projection area projected on the base substrate 11 and overlapping an orthographic projection area of the anode 151 projected on the base substrate 11, wherein the first electrodes 16 are connected to the gate line layer 143 through a plurality of via holes passing through the interlayer dielectric layer 146. Each of the first electrodes 16 and the anode 151 are spaced apart by the passivation protection layer 18. Compared with a conventional storage capacitor structure formed by two metal layers of a gate line layer and a source/drain electrode layer, a spacing between the first electrode 16 and the anode 151 of the storage capacitor Cst is increased, so that a parasitic capacitance between the first electrode 16 and the anode 151 can be reduced, thereby improving response times of the display panel.

In an embodiment of the present disclosure, the display panel further includes a plurality of signal lines spaced apart from and parallel with each other in a longitudinal direction. The signal lines include a data signal line Data, a power supply high-voltage signal line VDD, and a sensing signal line Sense. The signal lines are connected to the thin-film transistors, respectively. In one embodiment, the signal lines are arranged on the same layer as the source electrodes 144, the drain electrodes 145, and the first electrodes 16 of the thin-film transistors 140, so that the above-mentioned components can be formed simultaneously along with a process of etching the second metal layer.

Preferably, as shown in FIG. 2, the signal lines 17 are arranged on the same layer as the light shielding patterns 121, wherein the source electrodes 144 and the drain electrodes 145 of the thin-film transistors 140 are connected to the signal lines 17 through the vial holes passing through the interlayer dielectric layer 146 and the buffer layer 13. By using a structure that the signal lines 17 are disposed on the same layer as the light shielding patterns 121, the signal lines 17 can be formed at the same time during a preparation of the light shielding patterns 121, so that process steps and complication of the display panel will not be additionally increased, but also space originally remained for the signal lines 17 on the layer configured with the source electrodes 144 and the drain electrodes 145 can be saved, thereby aperture areas of the subpixel areas can be increased. In addition, based on the signal lines 17 and the light shielding patterns 121 disposed on the same layer, the light shielding layer 12 and the gate line layer 143 can be used for wiring layouts, so that a spacing between two electrodes of a parasitic capacitance formed between metal wirings and metal film layers is increased, such as a spacing between two electrodes of a parasitic capacitance formed by the signal lines 17 and the anode 151, thereby reducing a parasitic capacitance of the subpixel driving circuit, and response times of the display panel.

Figure 4:
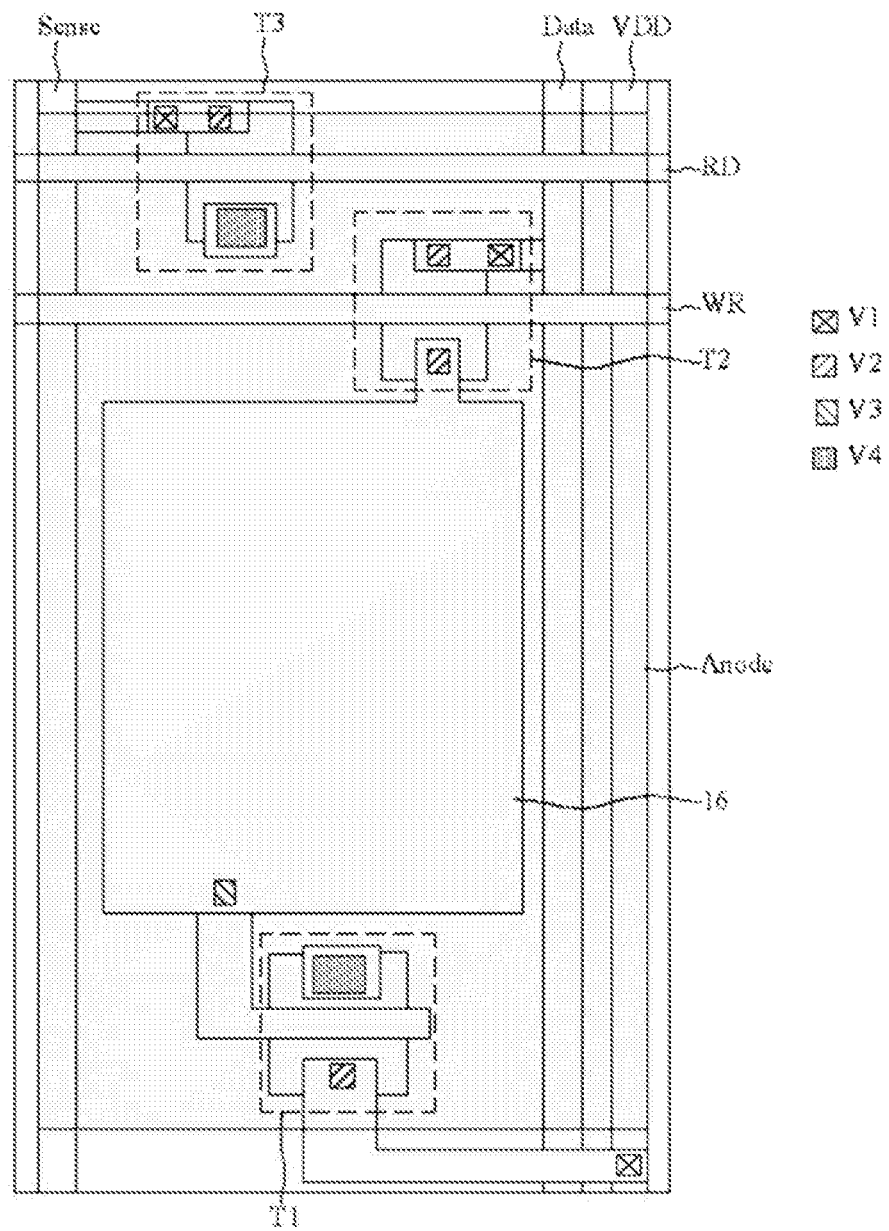
FIG. 4 is a schematic view showing a subpixel area provided by an embodiment of the present disclosure.

As shown in FIG. 4, FIG. 4 is a schematic view showing a subpixel area provided by an embodiment of the present disclosure. The source electrode of the driving thin-film transistor T1 is connected to the power supply high-voltage signal line VDD through a first via hole V1 passing through the interlayer dielectric layer 146 and the buffer layer 13, and is further connected to the active layer 141 through a second via hole V2 passing through the interlayer dielectric layer 146. The drain electrode of the driving thin-film transistor T1 is connected to the anode 151 (as a shading portion annotated in FIG. 4) through a fourth via hole V4 passing through the passivation protection layer 18, and is, at the same time, connected to other signal lines through the first via hole V1. The gate electrode of the driving thin-film transistor T1 is connected to the first electrode 16 through a third via hole V3 passing through the interlayer dielectric layer 146. A source electrode of the first switch thin-film transistor T2 is connected to the data signal line Data through the first via hole V1, and is further connected to the active layer 141 through the second via hole V2. The drain electrode of the first switch thin-film transistor T2 is connected to the active layer 141 through the second via hole V2. A gate electrode of the first switch thin-film transistor T2 is connected to a first scanning control signal line WR. A source electrode of the second switch thin-film transistor T3 is connected to the sensing signal line Sense through the first via hole T1, and is further connected to the active layer 141 through the second via hole V2. The drain electrode of the second switch thin-film transistor T3 is connected to the active layer 141 through the second via hole V2. A gate electrode of the second switch thin-film transistor T3 is connected to a second scanning control signal line RD.

The subpixel driving circuit provided by the embodiment of the present disclosure is the 3T1C structure. In one embodiment, the structure of the display panel provided by the embodiment of the present disclosure may also be adapted to a structure of a display panel having a subpixel driving circuit including a driving thin-film transistor and more than two switch thin-film transistors, which can achieve the same technical effects as that of the present embodiment, and is not reiterated here.

The embodiment of the present disclosure has advantageous effects as follows: the display panel provided by the embodiment of the present disclosure is provided with the first electrode disposed on the same layer as the source electrode and the drain electrode of the thin-film transistor, and the first electrode and the anode of the display device layer are used to cooperatively construct the storage capacitor. In addition, the signal lines and the light shielding patterns are disposed on the same layer, so that the light shielding layer and the gate line layer can be used for wiring layouts, and a spacing between two electrodes of a parasitic capacitance formed between metal wirings and metal film layers is increased, thereby reducing a parasitic capacitance of the subpixel driving circuit and response times of the display panel.

An embodiment of the present disclosure further provides a method of manufacturing a display panel, which is described in detail with reference to FIG. 2 below.

The method of manufacturing the display panel provided by the embodiment of the present disclosure includes:

Step S1: providing a base substrate 11, and etching a light shielding metal material deposited on the base substrate 11 to form a plurality of light shielding patterns 121.

Step S2: forming a buffer layer 13 on the base substrate 11, wherein the buffer layer 13 covers the light shielding patterns.

Step S3: depositing an active layer 141, a gate insulating layer 142, and a gate line layer 143 sequentially on a side of the buffer layer 13 away from the base substrate 11.

Step S4: forming an interlayer dielectric layer 146 on the side of the buffer layer 13 away from the base substrate 11, wherein the interlayer dielectric layer 146 covers the gate line layer 143, the gate insulating layer 142, and the active layer 141, wherein the interlayer dielectric layer 146 is etched to form a plurality of via holes exposing part of the active layer 141 ad the gate line layer 143.

Step S5: etching a source/drain electrode material deposited on the interlayer dielectric layer 146 to form a source electrode 144, a drain electrode 145, and a first electrode 16, wherein the source electrode 144 and the drain electrode 145 are connected to the active layer 141 through the via holes, respectively, and the first electrode 16 is connected to the gate line layer 143 through one of the via holes.

Step S6: forming a passivation protection layer 18 on a side of the interlayer dielectric layer 146 away from the buffer layer, wherein the passivation protection layer 18 covers the source electrode 144, the drain electrode 145, and the first electrode 16. The passivation protection layer 18 is etched to form a via hole passing through the passivation protection layer 18, wherein the via hole exposes part of the drain electrode 145.

Step S7: forming an anode 151 on the passivation protection layer, wherein the anode 151 is connected to the drain electrode 145 through the via hole.

Step S8: forming a pixel definition layer 19 on the passivation protection layer 19, and etching the pixel definition layer 19 to form a via hole exposing part of the anode 151, wherein a light-emitting layer 152 is formed in the via hole, and a cathode 153 is formed on a side of the light-emitting layer 152 away from the anode 151.

As shown in FIG. 2, the anode 151 has an orthographic projection area projected on the base substrate 11 overlapping an orthographic projection area of the first electrode 16 projected on the base substrate 11, wherein the anode 151 and the first electrode 16 cooperatively construct a storage capacitor Cst. The first electrode 16 and the anode 151 are spaced apart by the passivation protection layer 18. Compared with a conventional storage capacitor structure formed by two metal layers of a gate line layer and a source/drain electrode layer, a spacing between the first electrode 16 and the anode 151 of the storage capacitor Cst is increased, so that a parasitic capacitance between the first electrode 16 and the anode 151 can be reduced, thereby improving response times of the display panel.

In step S5, a plurality of signal lines 17 can also be formed on the same layer as the source electrode 144 at the same time when the source electrode 144, the drain electrode 145, and the first electrode 16 are formed by etching the source/drain material. The signal lines 17 include a data signal line Data, a power supply high-voltage signal line VDD, and a sensing signal line Sense, wherein the signal lines are connected to the source electrode 144 and the drain electrode 145, respectively.

Preferably, as shown in FIG. 2, the signal lines 17 and the light shielding patterns 121 are disposed on the same layer. That is, in step S1, when the light shielding material is processed to form the light shielding patterns 121 arranged in an array, the signal lines 17 are also formed at the same time. In step S4: the plurality of via holes are simultaneously etched to pass through the interlayer dielectric layer 146 and the buffer layer 13, thereby to expose part of the signal line. In step S5, a source/drain electrode metal material is deposited in the via holes, so that the source electrode 144 and the drain electrode 145 are connected to the signal lines 17 through the via holes, respectively.

Specifically, in step S1, the signal lines 17 and the light shielding patterns 121 are made of the same material and have the same structure. That is, they are all provided with a copper (Cu)/molybdenum (Mo) stacked structure, a CU/Mo/titanium (Ti) stacked structure, or a Mo/aluminum (Al)/Mo stacked structure. Furthermore, each of the signal line 17 and the light shielding pattern 121 has a thickness between 300 nanometers (nm) and 1000 nm in a direction along thickness of the display panel.

In step S2, the buffer layer 13 is made of silicon oxide (SiOx) or is a stacked structure of silicon nitride (SiNx)/SiOx. The buffer layer 13 has a thickness between 100 nm and 1000 nm in the direction along thickness of the display panel.

In step S3, the active layer 141 is deposited and formed by magnetron sputtering. The active layer 141 is made of indium gallium zinc oxide and has a thickness between 20 nm and 50 nm in the direction along thickness of the display panel.

In step S3, the gate insulating layer 142 and the gate line layer 143 are formed by one-time deposition using a self-aligned process. The gate insulating layer is made of SiOx or aluminum oxide (Al2O3), and has a thickness between 100 nm and 500 nm in the direction along thickness of the display panel. The gate line layer 143 is a Cu/Mo, a CU/Mo/Ti, or a Mo/Al/Mo metal stacked structure, and has a thickness between 300 nm and 1000 nm in the direction along thickness of the display panel.

In step S4, the interlayer dielectric layer 146 is made of SiOx or Al2O3 and has a thickness between 100 nm and 1000 nm in the direction along thickness of the display panel.

In step S5, the source electrode 144, the drain electrode 145, and the first electrode 16 are made of the same material and the same structure including the Cu/Mo, the CU/Mo/Ti, or the Mo/Al/Mo metal stacked structure, wherein each of the metal stacked structures has a thickness between 300 nm and 1000 nm in the direction along thickness of the display panel.

In step S6, the passivation protection layer 18 is made of SiOx and has a thickness between 100 nm and 1000 nm in the direction along thickness of the display panel.

In step S7, the anode 151 is an indium tin oxide (ITO)/silver (Ag)/ITO stacked structure and has a thickness between 100 nm and 300 nm in the direction along thickness of the display panel.

In step S8, the pixel definition layer 19 has a thickness between 1 micron (μm) and 3 μm in the direction along thickness of the display panel. The cathode 153 is an indium zinc oxide (IZO)/Ag/IZO stacked structure and has a thickness between 10 nm and 300 nm in the direction along thickness of the display panel.

Based on the method of manufacturing the display panel provided by the embodiment of the present disclosure, the first electrode is formed at the same time of the formation of the source electrode and the drain electrode, and the first electrode and the anode of the display device layer are used to construct the storage capacitor, so that a spacing between two electrodes of the storage capacitor is increased, thereby reducing a parasitic capacitance between the electrodes of the storage capacitor, and being beneficial to increase a turn on speed and a turn off speed of the subpixel driving circuit, as well as reducing response times of the display panel.

Accordingly, although the present invention has been disclosed as a preferred embodiment, it is not intended to limit the present invention. Those skilled in the art without departing from the scope of the present invention may make various changes or modifications, and thus the scope of the present invention should be after the appended claims and their equivalents.

What is claimed is:

1. A display panel, comprising:
   a base substrate;
   a light shielding layer disposed on the base substrate and comprising a plurality of light shielding patterns arranged in an array;
   a buffer layer disposed on the base substrate and covering the light shielding layer;
   a thin-film transistor array layer comprising a plurality of thin-film transistors, wherein each of the thin-film transistors comprises an active layer, a gate line layer, a source electrode, and a drain electrode;
   a display device layer disposed on a side of the thin-film transistor array layer away from the base substrate, and comprising an anode, a light-emitting layer, and a cathode disposed in a stack arrangement;
   a plurality of first electrodes disposed on the same layer as the source electrode, wherein an orthographic projection area of each first electrode projected on the base substrate overlaps an orthographic projection area of the anode projected on the base substrate;
   a storage capacitor comprising the first electrode and the anode; and
   a plurality of signal lines arranged on a same layer as the light shielding patterns, wherein an orthographic projection area of at least one of the plurality of signal lines projected on the base substrate overlaps with the orthographic projection area of the anode.

2. The display panel of claim 1, further comprising a gate insulating layer and an interlayer dielectric layer, wherein the gate line layer is disposed on a side of the gate insulating layer away from the base substrate, and the first electrodes are connected to the gate line layer through via holes in the interlayer dielectric layer.

3. The display panel of claim 2, wherein the thin-film transistors are connected to the signal lines through via holes in the interlayer dielectric layer and the buffer layer.

4. The display panel of claim 3, wherein the signal lines comprise a data signal line, a power supply high-voltage signal line, and a sensing signal line, and the thin-film transistors comprise a driving thin-film transistor and a switch thin-film transistor, wherein the driving thin-film transistor has a source electrode connected to the power supply high voltage signal line, a drain electrode connected to the anode, and a gate electrode connected to the first electrode.

5. The display panel of claim 4, further comprising a plurality of subpixel areas arranged in an array, wherein each of the subpixel areas is provided with a subpixel driving circuit, and wherein the subpixel driving circuit comprises the driving thin-film transistor, the storage capacitor, and at least two of the switch thin-film transistors.

6. The display panel of claim 5, wherein the subpixel driving circuit further comprises a first switch thin-film transistor and a second switch thin-film transistor, wherein the first switch thin-film transistor comprises a source electrode connected to the data signal line, a drain electrode connected to the gate electrode of the driving thin-film transistor, and a gate electrode connected to a first scanning control signal, and wherein the second switch thin-film transistor comprises a source electrode connected to the drain electrode of the driving thin-film transistor, a drain electrode connected to the sensing signal line, and a gate electrode connected to a second scanning control line.

7. The display panel of claim 1, wherein the plurality of signal lines extend in a same direction, and each of the light shielding patterns is disposed between two adjacent signal lines.

8. The display panel of claim 7, wherein the signal lines comprise a data signal line, a power supply high-voltage signal line, and a sensing signal line, and an orthographic projection area of the data signal line , the power supply high-voltage signal line, and the sensing signal line projected on the base substrate overlaps with the orthographic projection area of the anode.

9. The display panel of claim 8, wherein the data signal line is disposed between the power supply high-voltage signal line and the sensing signal line, and a distance between the sensing signal line and the data signal line is greater than a distance between the data signal line and the power supply high-voltage signal line.

10. The display panel of claim 9, wherein orthographic projection areas of the thin-film transistors projected on the base substrate are disposed between an orthographic projection area of the sensing signal line projected on the base substrate and an orthographic projection area of the data signal line projected on the base substrate.

11. The display panel of claim 9, further comprising a first scanning control signal line and a second scanning control signal line parallel to the first scanning control signal line, wherein the first scanning control signal line and the second scanning control signal line intersect with the signal lines, and orthographic projection areas of the first scanning control signal line and the second scanning control signal line projected on the base substrate overlap with the orthographic projection area of the anode.

12. The display panel of claim 11, wherein each of the first electrodes is disposed in an area surrounded by the first scanning control signal line, the data signal line, and the sensing signal line.

13. A display panel, comprising:
a base substrate;
a light shielding layer disposed on the base substrate and comprising a plurality of light shielding patterns arranged in an array;
a buffer layer disposed on the base substrate and covering the light shielding layer;
a thin-film transistor array layer comprising a gate insulating layer, an interlayer dielectric layer, and a plurality of thin-film transistors, wherein each of the thin-film transistors comprises an active layer, a gate line layer, a source electrode, and a drain electrode, and the gate line layer is disposed on a side of the gate insulating layer away from the base substrate;
a display device layer disposed on a side of the thin-film transistor array layer away from the base substrate, and comprising an anode, a light-emitting layer, and a cathode disposed in a stack arrangement;
a plurality of first electrodes disposed on a same layer as the source electrode, wherein an orthographic projection area of each first electrode projected on the base substrate overlaps an orthographic projection area of the anode projected on the base substrate;
a storage capacitor comprising the first electrode and the anode; and
a plurality of signal lines arranged on a same layer as the light shielding patterns, wherein the plurality of signal lines comprise a data signal line, an orthographic projection area of the data signal line projected on the base substrate overlaps with the orthographic projection area of the anode, and the thin-film transistors are connected to the signal lines through via holes went through in the interlayer dielectric layer and the buffer layer.

14. The display panel of claim 13, wherein the signal lines further comprise a power supply high-voltage signal line and a sensing signal line, and the thin-film transistors comprise a driving thin-film transistor and a switch thin-film transistor;
wherein the driving thin-film transistor has a source electrode connected to the power supply high voltage signal line, a drain electrode connected to the anode, and a gate electrode connected to the first electrode.

15. The display panel of claim 14, further comprising a plurality of subpixel areas arranged in an array, wherein each of the subpixel areas is provided with a subpixel driving circuit, and wherein the subpixel driving circuit comprises the driving thin-film transistor, the storage capacitor, and at least two of the switch thin-film transistors.

16. The display panel of claim 15, wherein the subpixel driving circuit further comprises a first switch thin-film transistor and a second switch thin-film transistor;
wherein the first switch thin-film transistor comprises a source electrode connected to the data signal line, a drain electrode connected to the gate electrode of the driving thin-film transistor, and a gate electrode connected to a first scanning control signal; and
wherein the second switch thin-film transistor comprises a source electrode connected to the drain electrode of the driving thin-film transistor, a drain electrode connected to the sensing signal line, and a gate electrode connected to a second scanning control line.

17. A method of manufacturing a display panel, comprising:
providing a base substrate;
depositing a light shielding metal material on the base substrate, and etching the light shielding metal material to form a plurality of light shielding patterns and a plurality of signal lines at intervals;
forming a buffer layer on the base substrate, wherein the buffer layer covers the light shielding patterns;
depositing an active layer, a gate insulating layer, and a gate line layer sequentially on a side of the buffer layer away from the base substrate;
forming an interlayer dielectric layer on the side of the buffer layer away from the base substrate, wherein the interlayer dielectric layer covers the gate line layer, the gate insulating layer, and the active layer;
depositing a source/drain electrode material on the interlayer dielectric layer and etching the source/drain electrode material to form a source electrode, a drain electrode, and a first electrode;
forming a passivation protection layer on a side of the interlayer dielectric layer away from the buffer layer; and
forming an anode, a light-emitting layer, and a cathode sequentially on the passivation protection layer;
wherein an orthographic projection area of the anode projected on the base substrate overlaps an orthographic projection area of the first electrode projected on the base substrate; a storage capacitor comprising the anode and the first electrode, and the orthographic projection area of the anode overlaps with an orthographic projection area of at least one of the plurality of signal lines projected on the base substrate.

18. The method of manufacturing the display panel of claim 17, wherein the signal lines comprise a data signal line, a power supply high-voltage signal line, and a sensing signal line, and the source electrode and the drain electrode are connected to the signal lines through via holes in the interlayer dielectric layer and the buffer layer respectively.

19. The method of manufacturing the display panel of claim 18, wherein the light shielding patterns and the signal lines are all provided with a copper and molybdenum laminated structure or a copper, molybdenum and titanium laminated structure.

* * * * *